(12) United States Patent
Matsunaga

(10) Patent No.: US 10,630,920 B2
(45) Date of Patent: Apr. 21, 2020

(54) IMAGE PROCESSING APPARATUS

(71) Applicant: Olympus Corporation, Hachioji-shi, Tokyo (JP)

(72) Inventor: Takuya Matsunaga, Tokyo (JP)

(73) Assignee: Olympus Corporation, Tokyo (JP)

(\*) Notice: Subject to any disclaimer, the term of this patent is extended or adjusted under 35 U.S.C. 154(b) by 209 days.

(21) Appl. No.: 15/946,712

(22) Filed: Apr. 5, 2018

(65) Prior Publication Data

US 2018/0338096 A1    Nov. 22, 2018

(30) Foreign Application Priority Data

May 22, 2017    (JP) ................................ 2017-100818

(51) Int. Cl.
| H04N 5/00 | (2011.01) |
| H04N 5/357 | (2011.01) |
| H04N 5/235 | (2006.01) |
| H04N 5/232 | (2006.01) |
| H04N 9/04 | (2006.01) |
| H04N 5/369 | (2011.01) |
| H01L 27/146 | (2006.01) |

(52) U.S. Cl.
CPC ......... *H04N 5/3572* (2013.01); *H01L 27/146* (2013.01); *H01L 27/14621* (2013.01); *H01L 27/14623* (2013.01); *H04N 5/2351* (2013.01); *H04N 5/23229* (2013.01); *H04N 5/3696* (2013.01); *H04N 5/36961* (2018.08); *H04N 9/04551* (2018.08); *H01L 27/14643* (2013.01)

(58) Field of Classification Search
CPC combination set(s) only.
See application file for complete search history.

(56) References Cited

U.S. PATENT DOCUMENTS

| 10,382,712 | B1* | 8/2019 | Forutanpour | ...... H04N 5/23229 |
| 2011/0031418 | A1* | 2/2011 | Shcherback | .............. G01J 1/04 |
| | | | | 250/559.29 |
| 2013/0002902 | A1* | 1/2013 | Ito | ........................ H04N 5/3572 |
| | | | | 348/224.1 |
| 2013/0155271 | A1* | 6/2013 | Ishii | ................... H04N 5/23212 |
| | | | | 348/222.1 |
| 2016/0191826 | A1* | 6/2016 | Furuya | ................... H04N 5/217 |
| | | | | 348/246 |
| 2017/0026592 | A1* | 1/2017 | Kuang | ............... H04N 5/23212 |
| 2018/0338096 | A1* | 11/2018 | Matsunaga | .......... H04N 5/3572 |

FOREIGN PATENT DOCUMENTS

| JP | 2016-127389 | 7/2016 |
| JP | 2016-144090 | 8/2016 |

\* cited by examiner

*Primary Examiner* — Sean T Motsinger
(74) *Attorney, Agent, or Firm* — John C. Pokotylo; Pokotylo Patent Services

(57) ABSTRACT

An image processing apparatus includes a pixel value acquisition circuit configured to acquire pixel values from image data that is generated by an imaging device including a detection pixel, and a pixel specification circuit configured to specify a flare-affected pixel that is affected by flare.

20 Claims, 20 Drawing Sheets

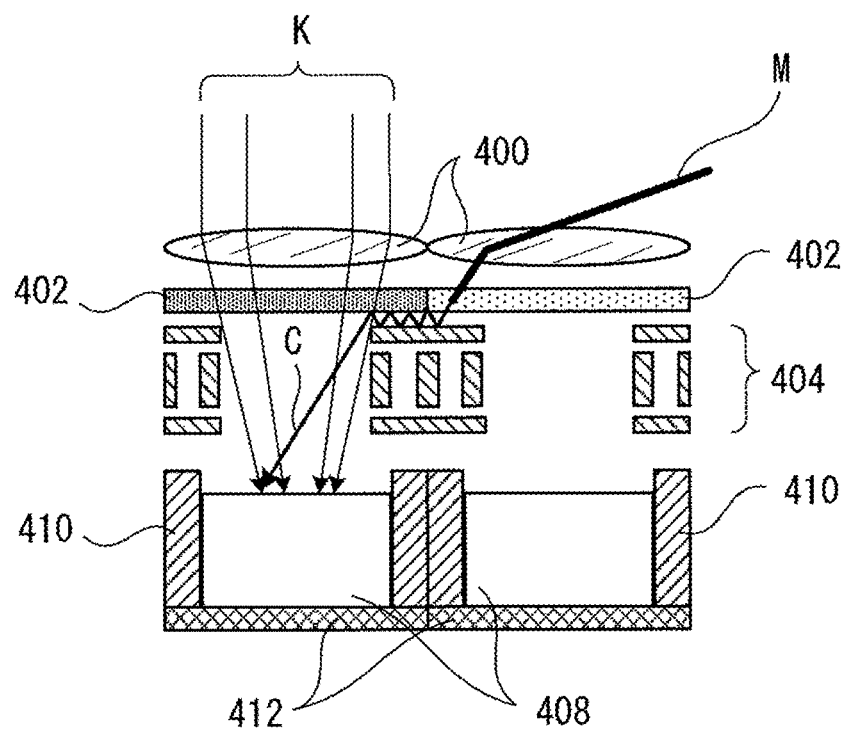
F I G. 2

|   | 0 | 1 | 2 | 3 | 4 | 5 | 6 | 7 | 8 | 9 | 10 |
|---|---|---|---|---|---|---|---|---|---|---|---|
| 0 | B | G | B | G | B | G | B | G | B | G | B |
| 1 | G | Fb | G | R | G | Fb | G | R | G | Fb | G |
| 2 | B | G | B | G | B | G | B | G | B | G | B |
| 3 | G | R | G | R | G | R | G | R | G | R | G |
| 4 | B | G | B | G | B | G | B | G | B | G | B |
| 5 | G | Fb | G | R | G | Fa | G | R | G | Fb | G |
| 6 | B | G | B | G | B | G | B | G | B | G | B |
| 7 | G | R | G | R | G | R | G | R | G | R | G |
| 8 | B | G | B | G | B | G | B | G | B | G | B |
| 9 | G | Fb | G | R | G | Fb | G | R | G | Fb | G |
| 10 | B | G | B | G | B | G | B | G | B | G | B |

|   | 0 | 1 | 2 | 3 | 4 | 5 | 6 | 7 | 8 | 9 | 10 |
|---|---|---|---|---|---|---|---|---|---|---|---|
| 0 | G | B | G | B | G | B | G | B | G | B | G |
| 1 | R | Fb | R | G | R | Fb | R | G | R | Fb | R |
| 2 | G | B | G | B | G | B | G | B | G | B | G |
| 3 | R | G | R | G | R | G | R | G | R | G | R |
| 4 | G | B | G | B | G | B | G | B | G | B | G |
| 5 | R | Fb | R | G | R | Fa | R | G | R | Fb | R |
| 6 | G | B | G | B | G | B | G | B | G | B | G |
| 7 | R | G | R | G | R | G | R | G | R | G | R |
| 8 | G | B | G | B | G | B | G | B | G | B | G |
| 9 | R | Fb | R | G | R | Fb | R | G | R | Fb | R |
| 10 | G | B | G | B | G | B | G | B | G | B | G |

FIG. 11

| DIRECTION OF IMAGE PICKUP PLANE | | CAMERA ORIENTATION LATERAL POSITION 1 | CAMERA ORIENTATION LONGITUDINAL POSITION 1 | CAMERA ORIENTATION LONGITUDINAL POSITION 2 | CAMERA ORIENTATION LATERAL POSITION 2 |
|---|---|---|---|---|---|
| SUBJECT BRIGHTNESS | HIGH | G0 × 1.0<br>G1 × 0.9<br>G2 × 1.2<br>G3 × 0.9 | G0 × 0.9<br>G1 × 1.2<br>G2 × 0.9<br>G3 × 1.0 | G0 × 0.9<br>G1 × 1.0<br>G2 × 0.9<br>G3 × 1.2 | G0 × 1.2<br>G1 × 0.9<br>G2 × 1.0<br>G3 × 0.9 |
| | LOW | G0 × 1.1<br>G1 × 1.0<br>G2 × 1.1<br>G3 × 1.0 | G0 × 1.0<br>G1 × 1.1<br>G2 × 1.0<br>G3 × 1.1 | G0 × 1.0<br>G1 × 1.1<br>G2 × 1.0<br>G3 × 1.1 | G0 × 1.1<br>G1 × 1.0<br>G2 × 1.1<br>G3 × 1.0 |

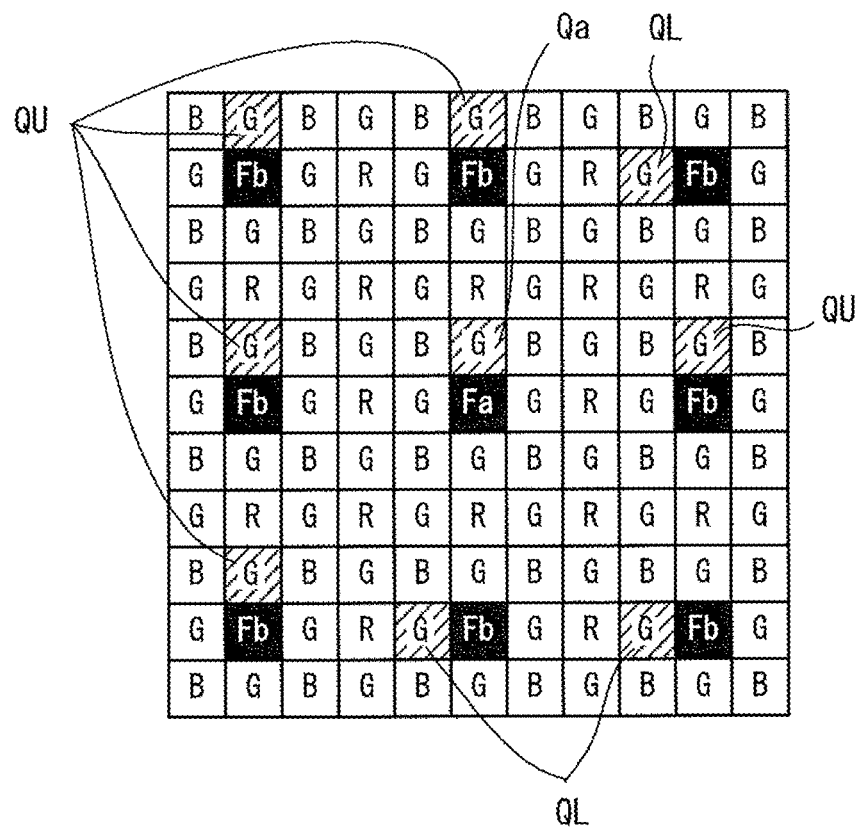
F I G. 16 A

IMAGE PROCESSING APPARATUS

CROSS-REFERENCE TO RELATED APPLICATIONS

This application is based upon and claims the benefit of priority of the prior Japanese Patent Application No. 2017-100818, filed on May 22, 2017, the entire contents of which are incorporated herein by reference.

BACKGROUND OF THE INVENTION

Field of the Invention

The present invention is related to an image processing apparatus that processes image data containing a signal of a focus detection pixel.

Description of the Related Art

Utilization of imaging devices in which focus detection pixels are arranged together with image pixels for picking up images has been spreading. A focus detection pixel is an element that receives different light fluxes of the imaging lens and outputs a signal for detecting the focus. When image pixels and focus detection pixels have different spectral characteristics in this type of imaging device, flare and ghost light sometimes affect pixel values of pixels existing around the focus detection pixels, leading to deteriorated quality of output image signals. Various techniques of correcting this influence of flare light have also been proposed.

Patent Document 1 for example proposes a method in which offset correction is performed on at least one pixel adjacent to a focus detection pixel on the basis of the values of a plurality of image pixels that are adjacent to the focus detection pixel and on the basis of image pixels not adjacent to the focus detection pixel existing in the vicinity.

Also, Patent Document 2 discloses a method in which a value of one of the pixels that are adjacent to a focus detection pixel is acquired as a correction target pixel, and whether or not the value of the correction target pixel is affected by flare is determined on the basis of the values of pixels that are adjacent to the focus detection pixel that are adjacent in the vicinity and the values of a plurality of pixels not adjacent to the focus detection pixel so as to correct the correction target pixel.

[Patent Document 1] Japanese Laid-open Patent Publication No. 2016-144090

[Patent Document 2] Japanese Laid-open Patent Publication No. 2016-127389

SUMMARY OF THE INVENTION

The image processing apparatus according to a present embodiment includes a pixel value acquisition circuit configured to acquire a pixel value from image data generated by an imaging device that includes a detection pixel, and a pixel specification circuit configured to specify a flare-affected pixel that is affected by flare, wherein the pixel value acquisition circuit sets, as a targeted detection pixel, a detection pixel that is a target of a flare determination, and sets, as a surrounding detection pixel, a detection pixel that is arranged around the targeted detection pixel in a prescribed area in a pixel arrangement including the targeted detection pixel, the pixel value acquisition circuit acquires, from image data, pixel values of a plurality of pixels that are adjacent to the targeted detection pixel and pixel values of a plurality of pixels that are adjacent to the surrounding detection pixel, and the pixel specification circuit specifies a flare-affected pixel that is affected by flare from among the plurality of pixels that are adjacent to the targeted detection pixel, on the basis of the pixel values of the plurality of pixels that are adjacent to the targeted detection pixel and the pixel values of the plurality of pixels that are adjacent to the surrounding detection pixel.

BRIEF DESCRIPTION OF THE DRAWINGS

FIG. 2 explains a situation where crosstalk is caused;

FIG. 9 illustrates an example in which pixels adjacent to a detection pixel have the same color;

FIG. 10 illustrates pixels selected for correction value calculation;

FIG. 11 illustrates a pixel arrangement of a case when pixels that are adjacent to a detection pixel have different colors;

FIG. 14 illustrates an example of a weighting table in accordance with subject brightness and camera orientation;

FIG. 15 illustrates pixels that are not adjacent to detection pixels in a case of a pixel arrangement in which pixels are adjacent to detection pixel have different colors;

FIG. 16A explains a specific example of determination condition (1);

DETAILED DESCRIPTION OF THE PREFERRED EMBODIMENTS

Figure 1:
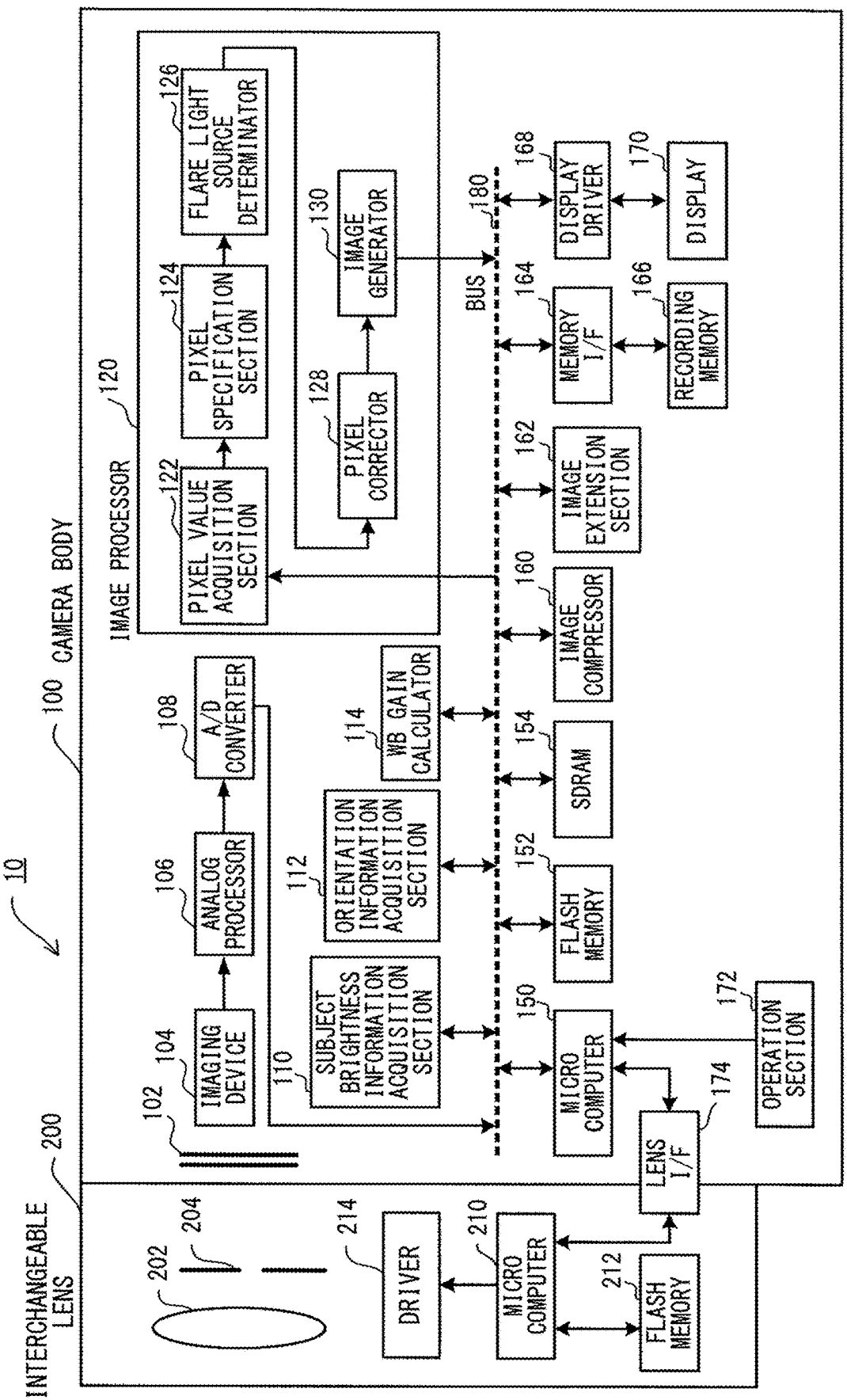
FIG. 1 is a functional block diagram of an image pickup device to which the image processing apparatus of the present invention is applied.

Hereinafter, explanations will be given for the embodiments of the present invention by referring to the drawings. FIG. 1 is a functional block diagram illustrating a configuration example of an image pickup device to which the image processing apparatus of the present invention is applied. A camera system 10 is explained as an example of the image pickup device. The camera system 10 includes a camera body 100 and an interchangeable lens 200 that is mounted on and dismounted from the camera body 100. Note that a camera with a fixed lens or an image pickup device embedded in a mobile terminal (smartphone) or a PC (Persona Computer) may be used as the image pickup device.

The camera body 100 includes a mechanical shutter 102, an imaging device 104, an analog processor 106, an A/D converter 108, a subject brightness information acquisition section 110, an orientation information acquisition section 112, a WB gain calculator 114 and an image processor 120.

The mechanical shutter 102 controls a time during which the subject light flux are allowed to pass. The mechanical shutter 102 is for example a known focal plane shutter.

The imaging device 104 picks up a subject image, performs photoelectric conversion, and outputs an image signal. In the imaging device 104, photodiodes are arranged in a manner of two-dimensional matrix, the photodiodes constituting the respective pixels. The imaging device 104 is for example a CCD (Charge Coupled Device) or a CMOS (Complementary MOS).

The imaging device 104 used in the present embodiment includes detection pixels between ordinary pixels (ordinary pixels will be referred to as image pixels hereinafter). Image pixels are pixels for generating an image, and are also referred to as image-pickup pixels. Detection pixels are pixels for detecting particular information. Detection pixels are for example pixels that output phase information of the subject and that is for detecting the focus. A pixel for detecting the focus is provided with for example a light shielding film so as to block incident light from one of the upper, lower, left and right directions. The structure of a pixel for detecting the focus will be described in detail in FIG. 3.

Alternatively, detection pixels may be pixels for detecting infrared rays. Pixels for detecting infrared rays have bandpass filters that selectively transmit near infrared rays and output infrared ray information of the subject.

The color filters of the detection pixels may have patterns different from those of the color filters of the image pixels. For example, color filters for white pixels are sometimes used for the focus detection pixels in order to increase the amount of the incident light. Also, in the imaging device 104 including focus detection pixels, focus detection pixels of green color filters are sometimes arranged at positions at which red pixels and blue pixels are arranged inherently. Also, as described above, color filters of infrared detection pixels selectively transmit near infrared rays, and thus have characteristics different from those of color filters of image pixels.

Hereinafter, explanations will be given for pixels for detecting the focus as detection pixels. Focus detection methods include the light shielding method and the PD division method. Focus detection pixels will be described in FIG. 3 and subsequent figures.

The analog processor 106 performs an analog process on an image signal read from the imaging device 104. The analog process includes a correlated double sampling process, a gain adjustment process, etc.

The A/D converter 108 is an analog/digital converter, and converts an image signal that received an analog process from the analog processor 106 into a digital image signal (image data).

The subject brightness information acquisition section 110 calculates subject brightness By according to for example APEX (Additive System of Photographic Exposure). Specifically, the subject brightness information acquisition section 110 calculates subject brightness By from a formula of $Bv=Av+Tv-Sv$ on the basis of aperture value Av, exposure time TV and photography sensitivity SV. The subject brightness information acquisition section 110 will also be referred to as a subject brightness information acquisition circuit.

The orientation information acquisition section 112 acquires information about the orientation at the time of the photography, such as for example information indicating whether the photography is so-called vertical photography or horizontal photography. The orientation information acquisition section 112 detects the orientation on the basis of an output from an orientation sensor (not illustrated) provided to the camera body 100 or to the interchangeable lens 200. The orientation information acquisition section 112 will also be referred to as an orientation information acquisition circuit.

The WB (White Balance) gain calculator 114 calculates a WB gain that is used for the white balance process performed by an image generator 130, which will be described later. White balance includes for example auto white balance, which is calculated from images, preset white balance, in which the photographer selects a value that is set in advance, etc.

The image processor 120 performs, on image data, the respective types of image processes, which will be described later. The image processor 120 includes a pixel value acquisition section 122, a pixel specification section 124, a flare light source determinator 126, a pixel collector 128 and the image generator 130. Note that the image processor 120 will also be referred to as an image processing apparatus.

Also, the analog processor 106, the A/D converter 108, the subject brightness information acquisition section 110, the orientation information acquisition section 112, the WB gain calculator 114, the image processor 120, etc. are implemented by hardware circuits using gate arrays.

In a screen, the pixel value acquisition section 122 sets, as a flare detection area, a prescribed scope having one detection pixel at its center. A flare detection area is a scope that is set for detecting a pixel affected by crosstalk of flare from among pixels that are adjacent to a detection pixel. The pixel value acquisition section 122 acquires the pixel values of pixels existing in the set flare detection area. A flare detection area consists of for example eleven vertical pixels× eleven horizontal pixels. The above described one detection pixel is a pixel that is a target of flare detection and will also be referred to as a targeted detection pixel. Also, a detection pixel existing around the targeted detection pixel in a flare detection area will also be referred to as a surrounding detection pixel.

Now, brief explanations will be given for the principle in which flare causes crosstalk. FIG. 2 explains a situation where crosstalk is caused by light that has been reflected from a lens surface or a surface in the frame of a mirror. It is assumed that flare light M has been incident on the right pixel at a shallow angle. Flare light M that has passed through a micro lens 400 and a color filter 402 of the right pixel is reflected by the upper surface of a wiring layer 404 at the boundary between the left and right pixels, and enters the left pixel. Flare light M that has entered an adjacent pixel becomes crosstalk C (crosstalk light).

A photodiode 408 of the left pixel receives crosstalk C, which is noise, in addition to inherent incident light K.

Because flare light M is attenuated while passing through the color filter 402, the amount of crosstalk C changes in accordance with the characteristics of the color filter 402 through which flare light M passes. Flare is also referred to as ghost.

The pixel value acquisition section 122 acquires, from image data and in a flare detection area, the pixel values of a plurality of pixels that are adjacent to the targeted detection pixel, the pixel values of a plurality of pixels that are adjacent to the surrounding detection pixels and the pixel values of a plurality of image pixels that are adjacent to neither the targeted detection pixel nor the surrounding detection pixels, the image data being generated by the imaging device 104 including detection pixels. The pixel value acquisition section 122 will also be referred to as a pixel value acquisition circuit.

The pixel specification section 124 specifies a pixel that is affected by crosstalk caused by flare from among the pixels that are upper, lower, left and right adjacent to a detection pixel. A pixel affected by crosstalk caused by flare from among pixels adjacent to a detection pixel will also be referred to as a flare-affected pixel.

Figure 3:
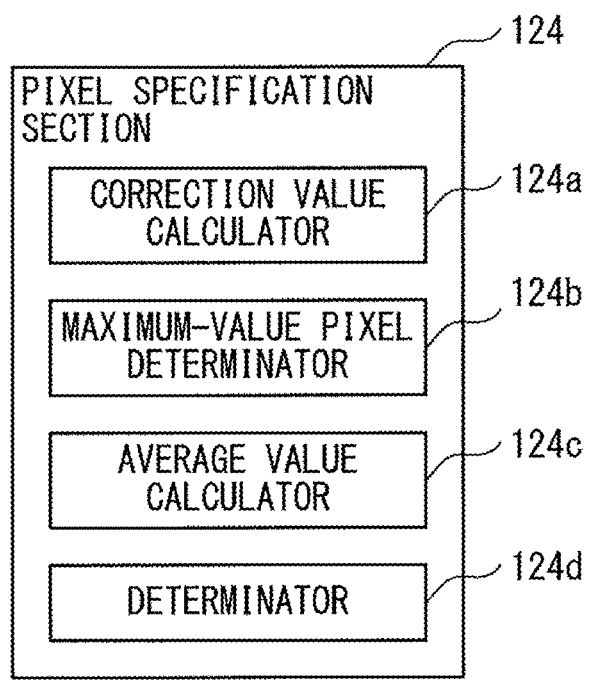
FIG. 3 is a block diagram illustrating a detailed configuration of a pixel specification section.

FIG. 3 is a block diagram illustrating a detailed configuration of the pixel specification section 124. A pixel specification section 124 includes a correction value calculator 124a, a maximum-value pixel determinator 124b, an average value calculator 124c and a determinator 124d. The pixel specification section 124 will also be referred to as a pixel specification circuit.

The correction value calculator 124a calculates a correction value that is used for correcting a pixel value acquired by the pixel value acquisition section 122. The correction value calculator 124a calculates a correction value by using a different method depending upon whether or not the plurality of pixels that are adjacent to the detection pixel have the same color or different colors. This is because the amount of crosstalk that affects adjacent pixels varies depending upon whether the adjacent pixels have the same color or different colors. A case when adjacent pixels have the same color is a case when the pixel arrangement is as illustrated in FIG. 9. A case when adjacent pixels have different colors is a case when the pixel arrangement is as illustrated in FIG. 11. FIG. 9 and FIG. 11 will be described later. Also, the calculation of correction values will be explained in detail in step S100 of FIG. 7. The correction value calculator 124a will also be referred to as a correction value calculation circuit.

On the basis of the pixel values acquired by the pixel value acquisition section 122, the maximum-value pixel determinator 124b determines a pixel having the highest pixel value from among the plurality of pixels that are adjacent to the detection pixel. A pixel having the highest pixel value will be referred to as a maximum value pixel. The maximum-value pixel determinator 124b determines, to be a first maximum value pixel, the pixel having the highest pixel value from among the plurality of pixels that are adjacent to the targeted detection pixel. Also, the maximum-value pixel determinator 124b determines, to be a second maximum value pixel, the pixel having the highest pixel from among the plurality of pixels that are adjacent to the surrounding detection pixels.

Further, the maximum-value pixel determinator 124b acquires the position of the first maximum value pixel for the targeted detection pixel, and treats the position as a first position. The maximum-value pixel determinator 124b acquires the position of the second maximum value pixel for the surrounding detection pixels, and treats the position as a second position. The maximum-value pixel determinator 124b will also be referred to as a maximum-value pixel determination circuit.

The average value calculator 124c calculates the average value of the pixel values of a plurality of pixels that are adjacent to neither the targeted detection pixel nor the surrounding detection pixels in the flare detection area. This average value will also be referred to as an image pixel average value. The average value calculator 124c will also be referred to as an average value calculation circuit.

Figure 10:
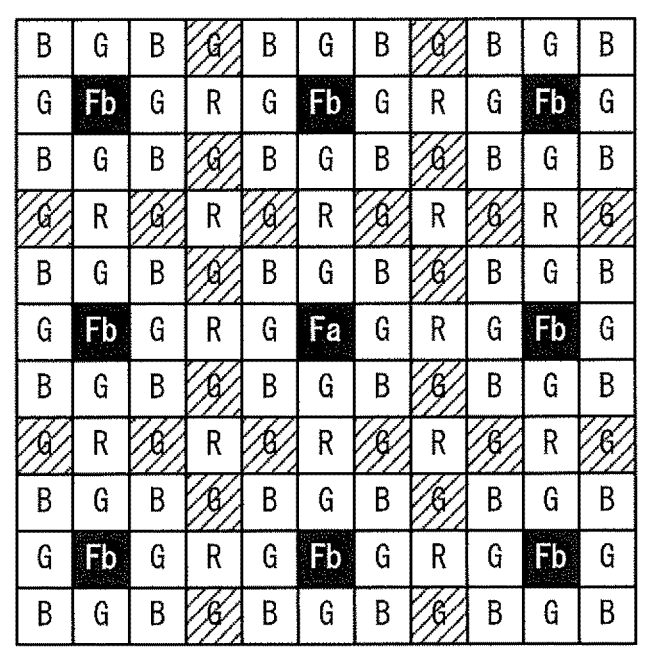

Specifically, when pixels that are adjacent to a detection pixel have the same color, the average value calculator 124c calculates the average value of G pixels that are adjacent to neither the targeted detection pixel nor the surrounding detection pixels. In FIG. 10, the G pixels with oblique lines are G pixels that are adjacent to neither the targeted detection pixel (Fa) nor the surrounding detection pixels (Fb). FIG. 10 will be described later.

Figure 15:
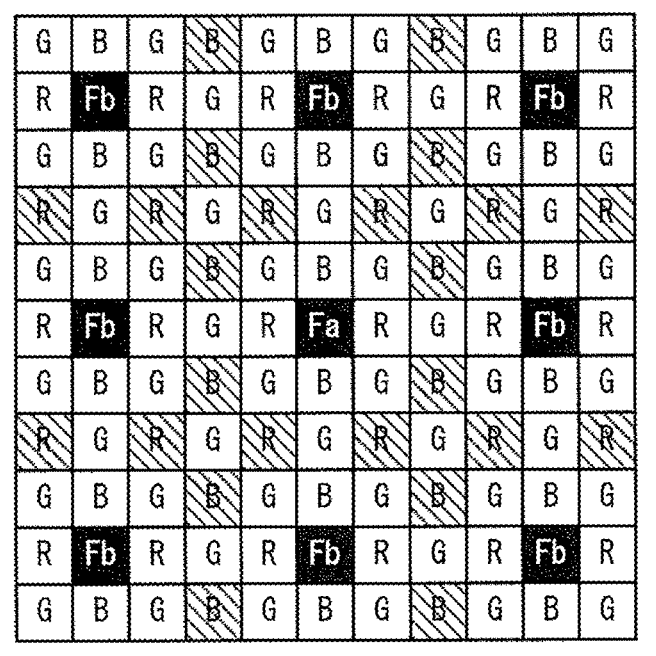

Also, when pixels that are adjacent to a detection pixel have different colors, the average value calculator 124c calculates the average values respectively of R pixels and B pixels that are adjacent to neither the targeted detection pixel nor the surrounding detection pixels. In FIG. 15, the R pixels and B pixels with oblique lines are R pixels and B pixels that are adjacent to neither the targeted detection pixel (Fa) nor the surrounding detection pixels (Fb). FIG. 15 will be described later.

The determinator 124d determines, on the basis of a prescribed determination condition, whether or not a flare-affected pixel exists among a plurality of pixels that are adjacent to the targeted detection pixel from the first and second positions acquired by the maximum-value pixel determinator 124b. The determinator 124d performs the determination on the basis of one of a plurality of determination conditions or a combination of them. The determination will be explained in detail in step S116 of FIG. 7. The determinator 124d will also be referred to as a determination circuit.

The flare light source determinator 126 determines whether or not a flare light source exists and the position of the flare light source. The flare light source determinator 126 determines whether or not a flare light source exists and the position thereof on the basis of a result acquired from the pixel specification section 124. For example, when the number of the flare-affected pixels specified by the pixel specification section 124 is equal to or greater than a prescribed number, the flare light source determinator 126 may determine that a flare light source exists. For example, the flare light source determinator 126 may treat 0.5% of the total number of the focus detection pixels as a prescribed number.

Also, in addition to the above determination based on the number of the flare-affected pixels, the flare light source determinator 126 may perform a determination of whether or not flare-affected pixels are concentrated on a partial area. This is because degradation in the image quality is caused by a flare light source only in an area that is affected by the flare light source, and thus flare-affected pixels can be determined to be not a result of the influence of the flare light source if the flare-affected pixels discretely spread over the entire screen. The partial area is for example an area accounting for 3% of the angle of field.

Also, the flare light source determinator 126 determines the position of the flare light source on the basis of the positional relationship of the flare-affected pixels with respect to the detection pixel. For example, the flare light source determinator 126 determines whether or not positional relationships of flare-affected pixels with respect to detection pixels involve many identical positional relationships. When determining that a great number of such positional relationships exist, the flare light source determinator 126 determines that the flare light source is located in the opposite direction from the flare-affected pixels with respect to the detection pixels in those identical positional relationships. "Many" means for example 70% or more.

Also, when determining that the positional relationships of the flare-affected pixels with respect to the detection pixels are distributed in the upper, lower, left and right directions around a certain point in the screen, the flare light source determinator 126 determines that the flare light source is located in the screen. A specific example of a flare light source position determination will be described later in FIG. 17A through FIG. 17C. The flare light source determinator 126 will also be referred to as a flare light source determination circuit.

When it is determined by the flare light source determinator 126 that a flare light source exists, the pixel collector 128 corrects the pixel values of the flare-affected pixels specified by the pixel specification section 124. The pixel collector 128 for example generates a correction value by performing an interpolation operation on surrounding image pixels, and corrects the pixel values of the flare-affected pixels. Also, the pixel collector 128 performs a known interpolation process also on detection pixels by using image pixels that surround the detection pixels. Note that the pixel collector 128 performs interpolation correction on detection pixels regardless of whether or not a flare light source exists. The pixel collector 128 will also be referred to as a pixel correction circuit.

The image generator 130 performs various types of processes including a process in which the system is converted into a configuration with 3CCDs, a white balance process, a color matrix process, gamma correction, a noise reduction process, etc., and converts RAW data into YC data.

Also, the camera body 100 includes a micro computer 150, a flash memory 152, an SDRAM (Synchronous Dynamic Random Access Memory) 154, an image compressor 160, an image extension section 162, a memory I/F (interface) 164, a recording memory 166, a display driver 168, a display 170, an operation section 172 and a lens I/F (interface) 174. The micro computer 150 is referred to as a CPU (Central Processing Unit).

The micro computer 150 is a processor that controls the entire camera system 10 in an integrated manner. The micro computer 150 reads a control program stored in the flash memory 152 so as to execute the control program, and performs various types of sequences of the camera. The operation section 172 and the lens I/F 174 are connected to the micro computer 150.

The flash memory 152 stores the above control program and information such as detection pixel position information etc.

The SDRAM 154 is a volatile memory that is for temporarily storing image data etc. and that can rewrite its information electrically. The SDRAM 154 temporarily stores image data output from the A/D converter 108 and image data that is processed in the image processor 120 etc.

The image compressor 160 compresses image data in a JPEG format for still images, and compresses image data using various schemes such as MPEG etc. for video images. The image extension section 162 extends JPEG image data or MPEG image data for reproducing and displaying images.

The memory I/F 164 is connected to the recording memory 166 so as to perform control of the reading and writing of data from and to the recording memory 166, examples of the data including image data, the header attached to image data, etc.

The recording memory 166 is a recording medium such as a memory card etc. that is detachable from the camera body 100. The recording memory 166 may be a hard disk etc. that is embedded in the camera body 100.

The display driver 168 is read from the SDRAM 154 or the recording memory 166, and makes an image displayed on the display 170 on the basis of an image data extended by the image extension section 162. The display 170 is implemented by for example an LCD, and displays an image output from the display driver 168.

The operation section 172 includes various types of input buttons such as a power button, a release button, a video button, a play button, a menu button, a directional pad, an OK button, etc., and an operation member (not illustrated) such as various types of input buttons, input keys, etc. The operation section 172 reports the operation statuses of these operation members to the micro computer 150. Also, the camera body 100 is provided with a bus 180 for connecting the micro computer 150, the subject brightness information acquisition section 110, etc.

The lens I/F 174 is an interface for conducting mutual communications between a micro computer 210 in the interchangeable lens 200 and the micro computer 150 in the camera body 100.

The interchangeable lens 200 is provided with a lens 202, a diaphragm 204, a micro computer 210, a flash memory 212 and a driver 214.

The lens 202 includes a plurality of optical lenses (including a focus lens for adjusting the focus) for forming a subject image. The lens 202 may be a fixed focal lens or may be a zoom lens. The aperture of the diaphragm 202 is variable in diameter, and controls the amount of light of the subject light fluxes that pass through the lens 202.

The micro computer 210 controls the entire interchangeable lens 200 by controlling the driver 214 in accordance with instructions from the micro computer 150 embedded in the camera body 100. Also, the micro computer 210 transmits information of the flash memory 212 to the micro computer 150 embedded in the camera body 100. The flash memory 212 stores, in addition to the control program, various types of information such as the optical characteristics and the adjustment value of the interchangeable lens 200, etc.

The driver 214 controls the position of the focus lens etc. included in the lens 202 and the aperture diameter of the diaphragm 204.

Figure 4:
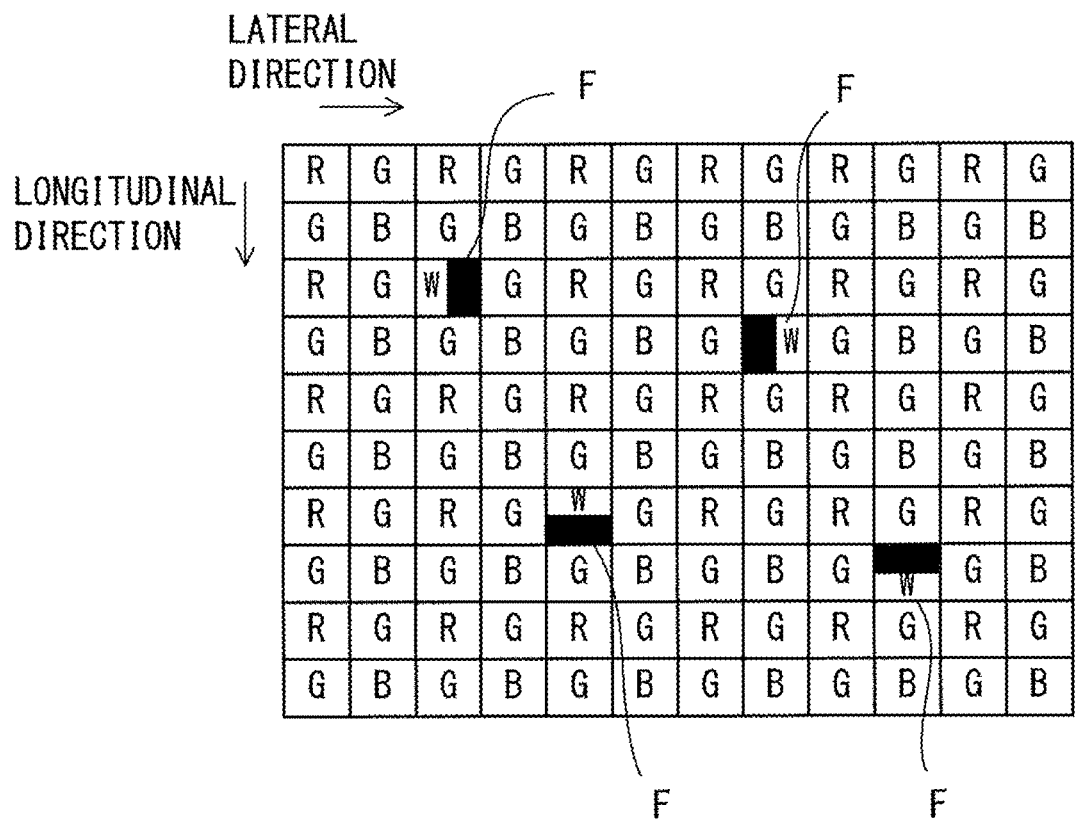
FIG. 4 illustrates an example of a pixel arrangement of an imaging device.

Next, explanations will be given for an example of a pixel arrangement of the imaging device 104. FIG. 4 illustrates an example of a pixel arrangement of the imaging device 104 according to the present embodiment. In the present embodiment, while a Bayer arrangement is described as an example of a pixel arrangement, the scope of the invention is not limited to Bayer arrangements, and various types of arrangements may be applied.

The respective pixels denoted by R, G and B are image pixels. Pixels denoted by F are detection pixels that are used for detecting the focus. The detection pixels are arranged between the image pixels. The detection pixels have transparent color filters. Symbols W represent transparency. The horizontal and vertical directions in the pixel arrangement will be referred to as the lateral directions and the longitudinal directions, respectively.

Also, not only transparent color filters but also colored color filters may be used for the detection pixels. Because transparent color filters transmit more light than colored color filters, leading to an advantage of allowing more light to be received. The arrangement of the detection pixels may be discrete as illustrated in FIG. 4 or may be linear. Also, the detection pixels may be arranged in a partial area of the image pickup plane or may be arranged all over the image pickup plane.

Figure 5:
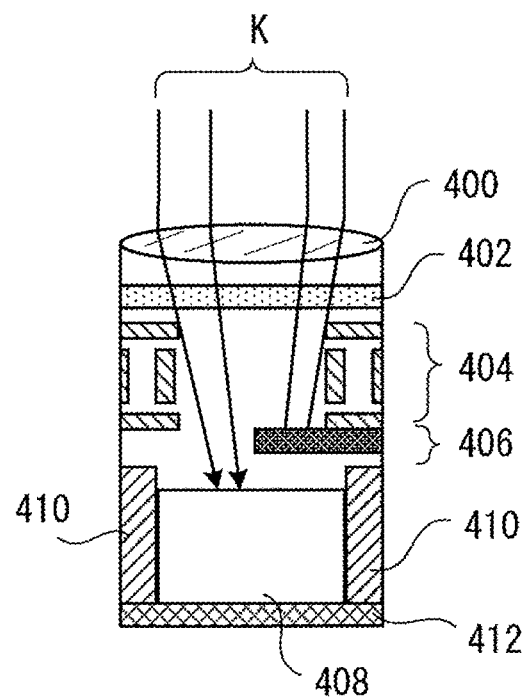
FIG. 5 is a sectional view illustrating the configuration of a detection pixel.

FIG. 5 is a sectional view illustrating the configuration of a detection pixel. A detection pixel includes a micro lens 400, a color filter 402, a wiring layer 404, a light shielding film 406, the photodiode 408, a basal plate 410 and a substrate 412. The micro lens 400, the wiring layer 404, the photodiode 408, the basal plate 410 and the substrate 412 are similar to those of the ordinary image pixel illustrated in FIG. 2.

The light shielding film 406 shields the left and right sides or the upper and lower sides of incident light K. In the example of FIG. 5, the right side of incident light K is shielded. For example, by detecting a phase difference between a signal on the left region and a signal on the right region, a shift of the focus is determined.

Figure 6:
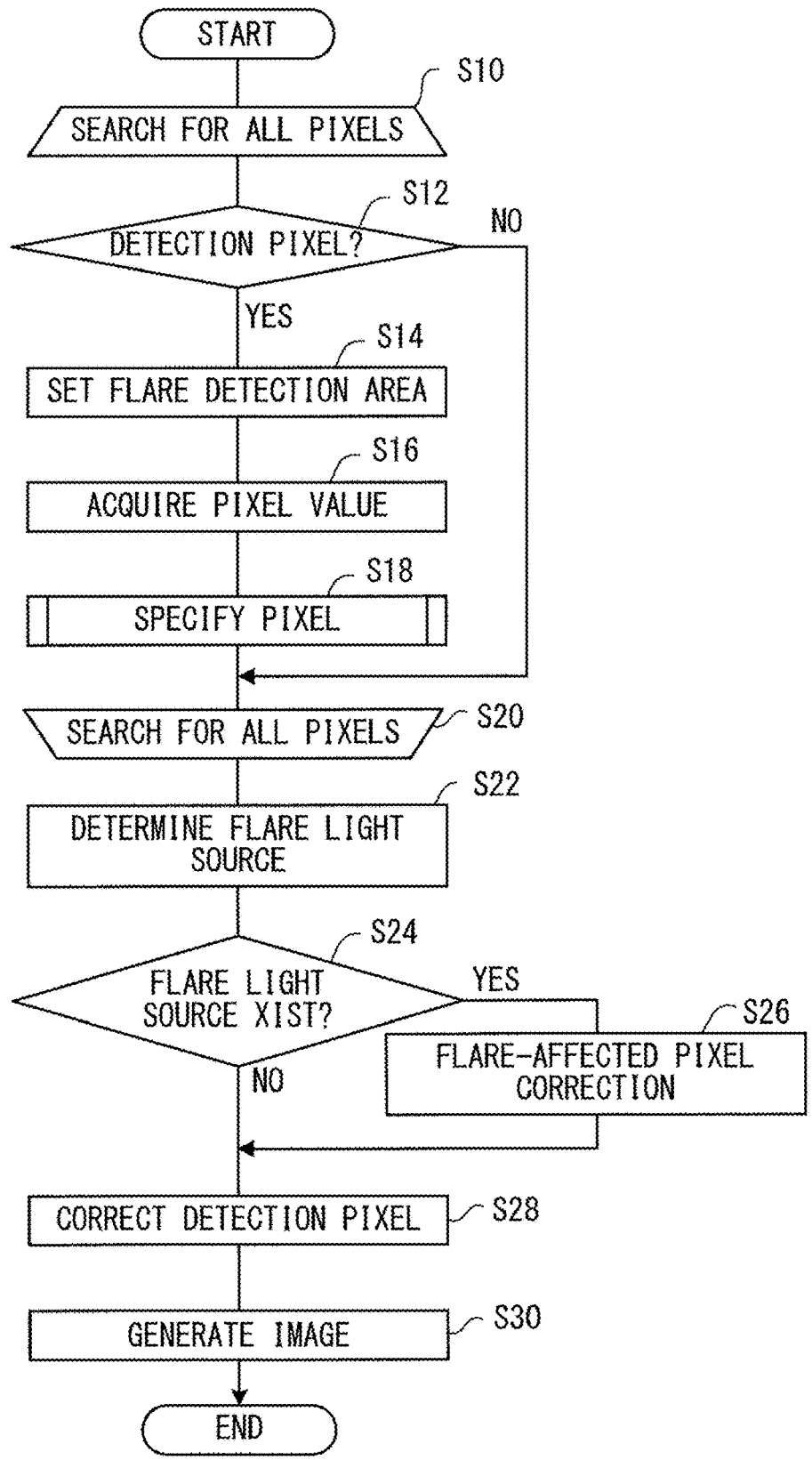
FIG. 6 is a flowchart explaining the procedures of an image process, particularly a process of correcting crosstalk of pixels that are adjacent to a detection pixel.

FIG. 6 is a flowchart explaining the procedures of an image process performed by the image processor 120. The flowchart illustrated in FIG. 6 is for a process of correcting crosstalk of pixels that are adjacent to detection pixels in the image process.

The image processor 120 starts an image process on the basis of image data that is output from the A/D converter 108. The pixel value acquisition section 122 searches all the pixels for detection pixels by performing for example raster scanning from the upper left corner to the lower right corner of each image.

The pixel value acquisition section 122 determines whether or not a pixel that is being the target of the search is a detection pixel (step S12). Note that because which of the pixels in the imaging device have detection pixels arranged on them is determined in advance, the pixel value acquisition section 122 may store detection pixel position information in the flash memory 152 in advance so as to refer to the stored detection pixel position information. This eliminates the necessity to search image data.

When determining that a pixel that is being the target of the search is not a detection pixel (NO in step S12), the pixel value acquisition section 122 returns to step S10 via step S20. The image processor 120 treats the next pixel as a target pixel, and performs a determination of a detection pixel.

When determining that a pixel that is being the target of the search is a detection pixel (YES in step S12), the pixel value acquisition section 122 sets a flare detection area, having that detection pixel being the target (targeted detection pixel) as the center of the area (step S14). The pixel value acquisition section 122 sets, as a flare detection area, an area consisting of for example eleven vertical pixels× eleven horizontal pixels, having the target detection pixel as its center.

Figure 8:
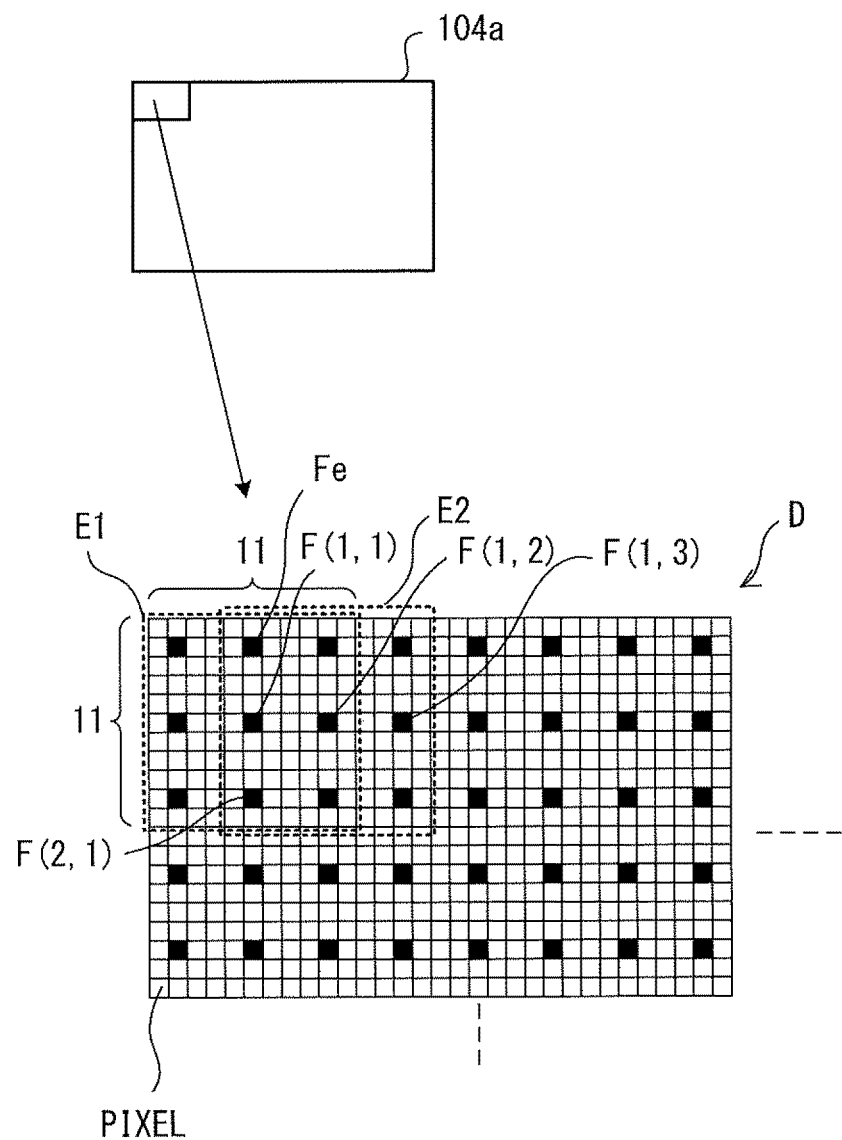
FIG. 8 illustrates a flare detection area that is set with a detection pixel as its center.

FIG. 8 illustrates a flare detection area that is set with a detection pixel as its center. The upper view of FIG. 8 illustrates an entire pixel 104a of the imaging device. The lower view of FIG. 8 is an enlarged view illustrating part of the entire pixel 104a of the imaging device, and illustrates pixel arrangement D. In pixel arrangement D, one block corresponds to one pixel. It is assumed that the black pixels are detection pixels and white pixels are image pixels in pixel arrangement D.

It is assumed that the pixel value acquisition section 122 treats detection pixel F (1, 1) as a target detection pixel (targeted detection pixel). First, the pixel value acquisition section 122 sets flare detection area E1 having detection pixel F (1, 1) as its center, the area E1 consisting of vertical eleven×horizontal eleven pixels. Note that when the position of a detection pixel is a position that does not allow the setting of a flare detection area of vertical eleven×horizontal eleven pixels, the pixel value acquisition section 122 may determine the result of step S12 to be NO. Specifically, when detection pixel Fe is a target detection pixel, the pixel value acquisition section 122 may determine the result of step S12 to be NO.

Then, a pixel specification process is performed for detection pixel F (1, 1) in step S16 and step S18, which will be described later. When the pixel specification process is terminated for detection pixel F (1, 1), the pixel specification process for detection pixel F (1, 2) is performed. The pixel value acquisition section 122 sets flare detection area E2 with detection pixel F (1, 2), and the processes of step S16 and step S18 are performed. As described above, the processes from step S12 through step S18 are performed for the entirety of the pixels 104a of the imaging device.

FIG. 6 is explained again. In the set flare detection area, the pixel value acquisition section 122 acquires the pixel values of a plurality of pixels that are adjacent to a targeted detection pixel, the pixel values of a plurality of pixels that are adjacent to surrounding detection pixels and the pixel values of a plurality of image pixels that are adjacent to neither a targeted detection pixel nor surrounding detection pixels (step S16).

Figure 7:
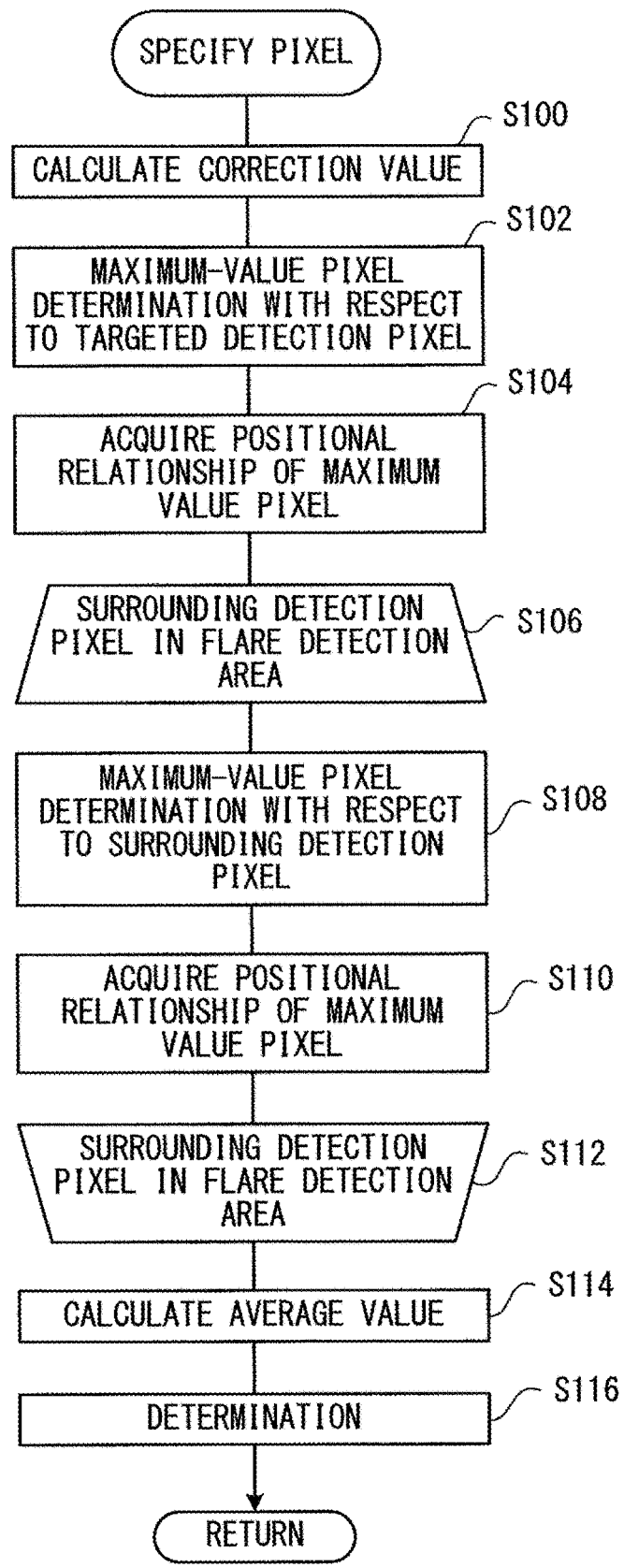
FIG. 7 is a subroutine for the procedures of a pixel specification process performed by a pixel specification section.

On the basis of the acquired pixel values, the pixel specification section 124 performs a pixel specification process in which it is specified whether or not the pixels that are adjacent to a detection pixel involve a pixel affected by crosstalk based on flare (step S18). FIG. 7 is a subroutine for the procedures of a pixel specification process performed by the pixel specification section 124.

<Correction Value Calculation>

The correction value calculator 124a calculates a correction value for a determination of a maximum value pixel (step S100). The correction value calculator 124a calculates a correction value by using a different method depending upon whether or not a plurality of pixels that are adjacent to a detection pixel have the same color or different colors. Note that correction values do not vary depending upon whether the detection pixel is a targeted detection pixel or surrounding detection pixels. This is because a targeted detection pixel and a surrounding detection pixel have the same configuration of adjacent pixels.

As described above, the pixel specification section 124 specifies a pixel having the maximum pixel value as a pixel affected by the crosstalk, from among the pixels that are adjacent to a detection pixel. However, when a set flare detection area is affected by flare, pixels that are adjacent to a detection pixel may be affected not only by the detection pixel but also crosstalk from other adjacent image pixels. In other words, without correcting influence of the crosstalk from other adjacent image pixels, the amount of crosstalk from detection pixels cannot be estimated accurately.

Then, in order to correct influence of crosstalk from other adjacent image pixels, different methods are used between when pixels that are adjacent to a detection pixel have the same color and when pixels that are adjacent to a detection pixel have different colors.

First, explanations will be given for correction of a case when pixels that are adjacent to a detection pixel have the same color. As described above, FIG. 9 illustrates a pixel arrangement of a flare detection area and is an example where pixels that are adjacent to a detection pixel have the same color. Among detection pixels, targeted detection pixels are denoted by Fa, and surrounding detection pixels are denoted by Fb. FIG. 9 illustrates an example in which detection pixels are arranged at positions that are inherently for R pixels in a Bayer arrangement. The pixels that are upper, lower, left and right adjacent to a detection pixel are all G pixels. Note that this is applied also to a case when detection pixels are arranged at the positions of B pixels instead of the positions of R pixels.

Also, G pixels arranged in B lines are referred to as GB pixels, and G pixels arranged in R lines are referred to as GR pixels. As illustrated in FIG. 9, GB1, which is one of the GB pixels, has B pixels that are left and right adjacent to it and has an R pixel that is upper adjacent to it. Similarly, GR1, which is one of the GR pixels, has an R pixel that is right adjacent to it and has B pixels that are upper and lower adjacent to it.

As described above, when this area is affected by flare, pixels that are adjacent to a detection pixel receive crosstalk also from an image pixel that is not a detection pixel. When it is assumed for example that pixels receive the crosstalk from their right adjacent pixels, GR1 receives crosstalk from an R pixel and GB1 receives crosstalk from a B pixel. Because R pixels and B pixels have different color filters, the GB pixels and the GR pixels receive different amounts of crosstalk. Thus, it is necessary to perform correction for canceling the difference in crosstalk between GB pixels and GR pixels.

The correction value calculator 124a selects an image pixel (G pixel in this example) having the same color as an image pixel adjacent to a detection pixel from among image pixels that not adjacent to detection pixels. FIG. 10 illustrates pixels selected for correction value calculation. In FIG. 10, the pixels with oblique lines are the selected pixels. The correction value calculator 124a classifies the plurality of selected image pixels into GB and GR, and calculates GBave and GRave as the average values of GB and GR respectively by using following formulas (1) and (2).

$$GBave = \text{integrated value of } GB/\text{total number of } GB \quad \text{formula (1)}$$

$$GRave = \text{integrated value of } GR/\text{total number of } GR \quad \text{formula (2)}$$

Then, the correction value calculator 124a calculates correction value T from the difference or the ratio between GBave and GRave. Specifically, the correction value calculator 124a calculates correction value T=GBave−GRave or correction value T=GBave/GRave. Note that the method based on differences is advantageous in view of time taken for the operation.

Next, explanations will be given for a case when pixels that are adjacent to a detection pixel has different colors. FIG. 11 illustrates a pixel arrangement of a case when pixels that are adjacent to a detection pixel have different colors. FIG. 11 is an example in which detection pixels are arranged at positions that are inherently for G pixels in a Bayer arrangement. Also, a similar pattern is applied when detection pixels are arranged at the positions of B pixels instead of G pixels.

As understood from FIG. 11, for B1, which is a B pixel adjacent to targeted detection pixel Fa, three adjacent pixels, i.e., pixels other than targeted detection pixel Fa, are all G pixels. Also, for R1, which is an R pixel adjacent to targeted detection pixel Fa, three adjacent pixels, i.e., pixels other than targeted detection pixel Fa, are all G pixels. This is applied to surrounding detection pixels Fb.

As described above, when pixels that are adjacent to a detection pixel have different colors, the amount of crosstalk from image pixels is constant in the amount of the crosstalk that is received by pixels adjacent to the detection pixel because all the crosstalk from image pixels is crosstalk from G pixels. However, R pixels and B pixels inherently have different spectral characteristics, making it necessary to perform correction to cancel the difference.

$$R \text{ pixel correction value } Tr = R \text{ pixel white balance gain}$$

$$B \text{ pixel correction value } Tb = B \text{ pixel white balance gain}$$

The correction value calculator 124a acquires white balance gains from the WB gain calculator 114. Note that a white balance gain may be a set value that is set by the photographer with an intention.

The maximum-value pixel determinator 124b determines a maximum value pixel from among a plurality of pixels that are adjacent to a targeted detection pixel (step S102). The maximum-value pixel determinator 124b acquires the positional relationship of the maximum value pixel with respect to the targeted detection pixel on the basis of the determined maximum value pixel (step S104).

<Case when Colors are the Same>

First, explanations will be given for a maximum value pixel determination and the acquisition of a positional relationship in a case, as explained in FIG. 9 and FIG. 10, when pixels that are adjacent to a targeted detection pixel have the same color.

Figure 12:
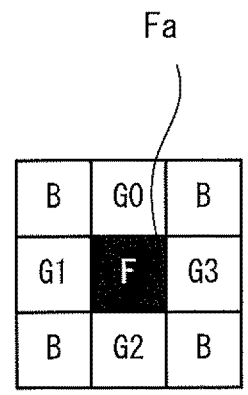
FIG. 12 illustrates the positions of pixels that are adjacent to a targeted detection pixel in a case when pixels that are adjacent to the targeted detection pixel have the same color.

FIG. 12 illustrates the positions of pixels that are adjacent to a targeted detection pixel in a case when pixels that are adjacent to the targeted detection pixel have the same color. As illustrated in FIG. 12, the four G pixels that are upper, lower, left and right adjacent to targeted detection pixel Fa are treated as G0, G1, G2 and G3. The maximum-value pixel determinator 124b calculates a maximum value while taking a correction value into consideration, the correction value having been calculated by the correction value calculator 124a. Specifically, the maximum-value pixel determinator 124b determines a pixel having a maximum value while taking the correction value into consideration from among the four adjacent pixels by using formula (3) below.

$$\text{MAX} = \max(G0 \text{ pixel value-correction value } T, G1 \text{ pixel value-correction value } T, G2 \text{ pixel value-correction value } T, G3 \text{ pixel value-correction value } T) \quad \text{formula (3)}$$

In the above calculation, when the correction values are calculated from ratios, /multiplication may be used instead of subtraction. When all the pixel values after the correction are the same, priority orders may be set in accordance with the subject brightness, which will be described later, and the camera orientation or it is also possible to determine that there is no maximum value.

Next, explanations will be given for the acquisition of a positional relationship in a case when pixels that are adjacent to a targeted detection pixel have the same color. As described above, the maximum-value pixel determinator 124b acquires the positional relationship of the maximum value pixel with respect to the targeted detection pixel. When "MAX=G0 pixel value-correction value T" is satisfied, the positional relationship is an upper position. When "MAX=G1 pixel value-correction value T" is satisfied, the positional relationship is a left position. When "MAX=G2 pixel value-correction value T" is satisfied, the positional relationship is a lower position. When "MAX=G3 pixel value-correction value T" is satisfied, the positional relationship is a right position.

<Case when Colors are Different>

Figure 13:
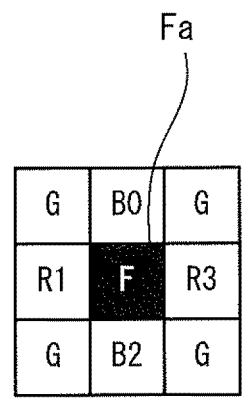
FIG. 13 illustrates the positions of pixels that are adjacent to a targeted detection pixel in a case when pixels that are adjacent to the targeted detection pixel have different colors.

Next, explanations will be given for the determination of a maximum value pixel and the acquisition of a positional relationship in a case, as explained in FIG. 11, when pixels that are adjacent to a detection pixel have different colors. FIG. 13 illustrates the positions of pixels that are adjacent to a targeted detection pixel in a case when pixels that are adjacent to the targeted detection pixel have different colors. As illustrated in FIG. 13, the four pixels that are upper, lower, left and right adjacent to targeted detection pixel Fa are treated as B0, R1, B2 and R3. It is a case when detection pixels are arranged at the positions of G pixels.

The maximum-value pixel determinator 124b calculates a maximum value while taking a correction value into consideration, the correction value having been calculated by the correction value calculator 124a. Specifically, the maximum-value pixel determinator 124b determines a pixel having a maximum value while taking the correction value into consideration from among the four adjacent pixels by using formula (4) below.

$$\text{MAX}=\max(B0 \text{ pixel value} \times B \text{ white balance gain,}$$

$$R1 \text{ pixel value} \times R \text{ white balance gain,}$$

$$B2 \text{ pixel value} \times B \text{ white balance gain,}$$

$$R3 \text{ pixel value} \times R \text{ white balance gain}) \quad \text{formula (4)}$$

Then, as described below, the maximum-value pixel determinator 124b acquires the positional relationship of the maximum value pixel with respect to the targeted detection pixel. When "MAX=B0 pixel value×B white balance gain" is satisfied, the positional relationship is an upper position. When "MAX=R1 pixel value×R white balance gain" is satisfied, the positional relationship is a left position. When "MAX=B2 pixel value×B white balance gain" is satisfied, the positional relationship is a lower position. When "MAX=R3 pixel value×R white balance gain" is satisfied, the positional relationship is a right position.

<Weighted Correction>

Also, the maximum-value pixel determinator 124b may add weighted correction in accordance with the subject brightness and the camera orientation in the determination of a maximum value pixel in step S102 above. FIG. 14 illustrates an example of a weighting table in accordance with the subject brightness and the camera orientation. The weighting table determines weighting coefficients with a matrix of the camera orientation and the subject brightness. The horizontal row is for camera orientation (four types of orientation), and the vertical column is for the subject brightness (level) on the weighting table. The weighting table of FIG. 14 is a table for an example of a pixel arrangement in which pixels that are adjacent to a detection pixel have the same color.

In an environment where the subject brightness is high for example, the light source is the sunlight in general, and thus the light source is often at a high position in the angle of field. Accordingly, in an environment where the subject brightness is high, there is a high possibility that intense light will be received from the upper side of the subject. This results in a high possibility that the influence of flare will occur in a pixel (G2 in FIG. 12) that is lower adjacent to a detection pixel. Then, when the subject brightness is high and the camera orientation is lateral position 1, a high weighting coefficient (1.2) is set for a pixel (G2 in FIG. 12) that is lower adjacent to a detection pixel. Also, when the subject brightness is high and the camera orientation is lateral position 2, a high weighting coefficient (1.2) is set for a pixel (G0 in FIG. 12) that is upper adjacent to a detection pixel (in the state illustrated in FIG. 12).

Also, in an environment where the subject brightness is low, the light source is artificial light source in general, and intense light is not always received from an upper portion in the angle of field, unlike the case of sunlight. Then, in an environment such as this, weighting coefficients are set to be lower. Also, when the subject brightness is high and the camera orientation is a lateral position, weighting coefficients are set to be higher for pixels positioned on the upper and lower sides of a detection pixel than those set for pixels positioned on the left and right sides of the detection pixel.

Next, in a case when the camera orientation is longitudinal position 1, a high weighting coefficient is set for a pixel (G1 in FIG. 12) that is lower adjacent to a detection pixel. In a case when the camera orientation is longitudinal position 2 by contrast, a high weighting coefficient is set for a pixel (G3) that is lower adjacent to a detection pixel.

Thereby, when for example the subject brightness is high and the camera orientation is lateral position 1, formula (1) above is modified to formula (5) below.

$$\text{MAX}=\max((G0 \text{ pixel value-correction value}) \times 1.0,$$

$$(G1 \text{ pixel value-correction value}) \times 0.9,$$

$$(G2 \text{ pixel value-correction value}) \times 1.2,$$

$$(G3 \text{ pixel value-correction value}) \times 0.9) \quad \text{formula (5)}$$

The maximum-value pixel determinator 124b determines a maximum value pixel from formula (5).

In a case of a pixel arrangement in which pixels that are adjacent to a detection pixel have different colors as well, the weighting table is similar to that exemplified in FIG. 14. Similar effects can be achieved by replacing symbols (G0, G1, G2 and G3) with (B0, R1, B2 and R3) on the weighting table illustrated in FIG. 14. In a case when the subject brightness is high and the camera orientation is lateral 1 for example, formula (4) above is modified to formula (6) below.

$$\text{MAX}=\max(B0 \text{ pixel value} \times B \text{ white balance gain} \times 1.0,$$

$$R1 \text{ pixel value} \times R \text{ white balance gain} \times 0.9,$$

$$B2 \text{ pixel value} \times B \text{ white balance gain} \times 1.2,$$

$$R3 \text{ pixel value} \times R \text{ White balance gain} \times 0.9) \quad \text{formula (6)}$$

The maximum-value pixel determinator 124b determines a maximum value pixel from formula (6). Note that while explanations are given for an example in which the subject brightness and the camera orientation are combined, weighting may be performed on the basis of only one of them.

Then, the maximum-value pixel determinator 124b performs a determination of a maximum value pixel for surrounding detection pixels in a flare detection area from step S106 through step S112, which will be explained below. When a flare detection area as exemplified in FIG. 9 or FIG. 11 is 11×11, a maximum value pixel is calculated for each of the eight surrounding detection pixels (Fb) and the positional relationship of the maximum value pixel is determined for each of the surrounding detection pixels. FIG. 12 and FIG. 13 are applied by replacing Fa with Fb.

The maximum-value pixel determinator 124*b* calculates a maximum value pixel for one surrounding detection pixel (step S108). The maximum-value pixel determinator 124*b* utilizes formulas (3) and (4), the correction value calculated in step S100, the above weighting table (14), etc. The maximum-value pixel determinator 124*b* determines a maximum value pixel for each surrounding detection pixel by using a method similar to that in step S102. In the examples of FIG. 9 and FIG. 11, a maximum value pixel is determined for each of the eight surrounding detection pixels (Fb).

On the basis of the determined maximum value pixel, the maximum-value pixel determinator 124*b* acquires the positional relationship of the maximum value pixel with respect to each of the surrounding detection pixels (step S110). The maximum-value pixel determinator 124*b* acquires the positional relationship of maximum value pixels with respect to surrounding detection pixels by using methods similar to that used in step S104.

As described above, the maximum-value pixel determinator 124*b* determines the positional relationships of maximum value pixels with respect to detection pixels of targeted detection pixels and surrounding detection pixels (total nine in this example). As described above, a positional relationship of a maximum value pixel with respect to a targeted detection pixel will also be referred to as a first position. Also, a positional relationship of a maximum value pixel with respect to a surrounding detection pixel will also be referred to as a second position.

The average value calculator 124*c* calculates an average value (image pixel average value) in a flare detection area (step S114). As described above, when the arrangement is a pixel arrangement where pixels that are adjacent to a detection pixel have the same color, the average value calculator 124*c* calculates the average value of G pixels that are adjacent to neither targeted detection pixels nor surrounding detection pixels. "G pixels not adjacent to a detection pixel" are the G pixels with oblique lines in FIG. 10.

Also, when pixels that are adjacent to a detection pixel have different colors, the average value calculator 124*c* calculates the average values respectively for R pixels and B pixels that are adjacent to neither targeted detection pixels nor surrounding detection pixels. The R pixels and B pixels with oblique lines in FIG. 15 are R pixels and B pixels that are not adjacent to detection pixels.

On the basis of a prescribed determination condition, the determinator 124*d* determines whether or not there is a pixel that is affected by crosstalk of flare. The determinator 124*d* may perform the determination on the basis of a combination of the following determination conditions (1), (2) and (3) or on the basis of only one of them.

(1) The second positions acquired respectively for a plurality of surrounding detection pixels are classified into four positions, i.e., upper, lower, left and right positions. Next, the most positions are acquired from among the four positions. When the most positions and the first position are identical, the first maximum value pixel is determined to be a flare-affected pixel.

(2) The second positions acquired respectively for a plurality of surrounding detection pixels are classified into four positions, i.e., upper, lower, left and right positions. Next, the most positions are acquired from among the four positions. When the number of the most positions is equal to or greater than a prescribed threshold, the pixels corresponding to the most positions from among the pixels that are adjacent to targeted detection pixels are determined to be flare-affected pixels.

(3) When the first maximum value pixel is higher than the image pixel average value calculated by the average value calculator 124*c*, that first maximum value pixel is determined to be a flare-affected pixel.

Figure 16B:
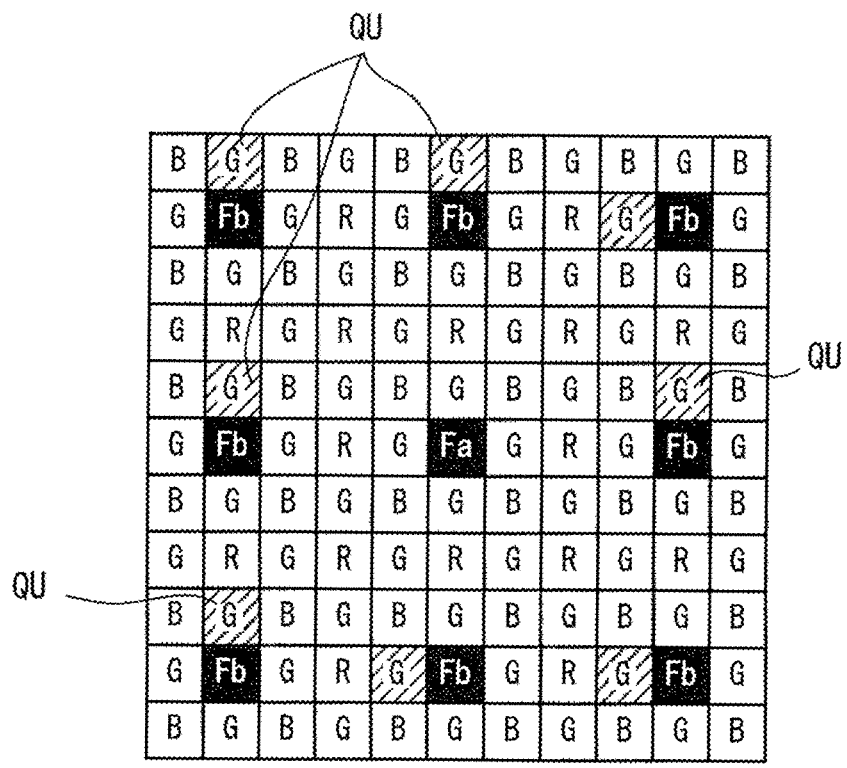
FIG. 16B explains a specific example of determination condition (2)

FIG. 16A and FIG. 16B specifically explain determination conditions. FIG. 16A illustrates an example based on the determination condition of (1). It is assumed that the maximum value pixel for the targeted detection pixel (Fa) has been determined to be an upper position (Qa). It is also assumed that the maximum value pixels for surrounding detection pixels Fb have been determined to be G pixels with oblique lines. Five upper positions (QU) and three left positions (QL) exist as the positions of the maximum value pixels.

Because there are five upper positions (QU) from among the positions of the maximum value pixels (second positions) for surrounding detection pixels Fb, the upper positions are determined to be the most positions. Then, the most positions as the second position and the first position are both upper positions, which means that they are identical. Thereby, maximum value pixel Qa is determined to be a flare-affected pixel.

FIG. 16B illustrates an example based on the determination condition of (2). It is assumed that maximum value pixels for surrounding detection pixels Fb have been determined to be G pixels with oblique lines. Because there are five upper positions (QU) from among the positions of the maximum value pixels (second positions) for surrounding detection pixels Fb, the upper positions are determined to be the most positions. When a prescribed threshold is 5 for example, the number of the upper positions, which exist the most, is equal to or greater than the threshold, and thus pixels at the upper positions of targeted detection pixels Fa are determined to be flare-affected pixels.

When the above condition is met, the determinator 124*d* specifies, as a crosstalk-affected pixel caused by flare, the pixel having the highest pixel value from among a plurality of pixels that are adjacent to the targeted detection pixel. When the above condition is not met, the determinator 124*d* determines that pixels that are adjacent to the targeted detection pixel do not include a pixel that needs flare correction.

The pixel specification section 124 proceeds to step S20 of FIG. 6. When determining that the search has not been terminated for all pixels, the pixel specification section 124 returns to step S10, and performs the process for the next pixel. As explained in FIG. 8, a targeted detection pixel is changed sequentially, and the flare-affected pixel corresponding to each detection pixel is specified in the screen.

Note that the processes from step S10 through step S20 may be performed for the entire effective area of the imaging device 104; however the target may be restricted to a partial area (an area that is set in advance for example). The partial area may change in response to a change of the photography mode. This is because restricting process target areas will reduce the process time.

When determining that the search has been terminated for all pixels, the pixel specification section 124 proceeds to step S22. The flare light source determinator 126 determines whether or not a flare light source exists and the position thereof on the basis of the result acquired by the pixel specification process in the screen. When for example the number of the flare-affected pixels with respect to the detection pixels in the screen is equal to or greater than a prescribed number, the flare light source determinator 126 may determine that a flare light source exists. Specifically, the flare light source determinator 126 may determine that a flare light source exists when the number of the flare-affected pixels is equal to or greater than 0.5% of the total number of the detection pixels.

Also, the flare light source determinator 126 may perform the determination also on the basis of whether or not flare-affected pixels are concentrated on a particular area in addition to the number of the flare-affected pixels. This is because degradation in the image quality is caused by a flare light source only in an area that is affected by the flare light source, and thus flare-affected pixels can be determined to be not a result of the influence of the flare light source if the flare-affected pixels are distributed discretely over the entire screen. The particular area may be for example an area accounting for 3% of the angle of field.

Also, the flare light source determinator 126 determines the position of the flare light source on the basis of the positional relationships between the detection pixels and the flare-affected pixels. When for example the positional relationships between the detection pixels and the flare-affected pixels are in the same direction in the entire screen, the flare light source is determined to be located in the opposite direction from that direction.

Figure 17A:
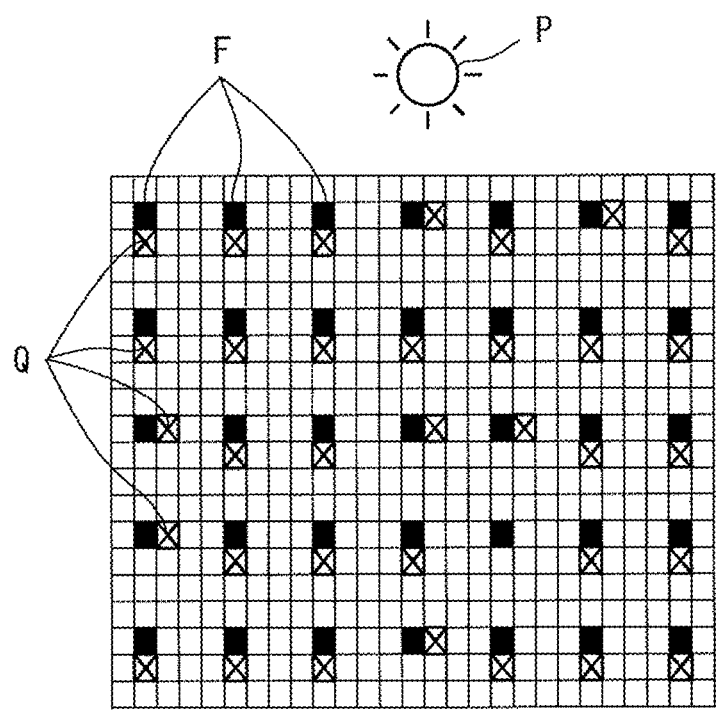
FIG. 17A illustrates example 1 in which the position of a flare light source is determined by the positions of flare-affected pixels.
Figure 17B:
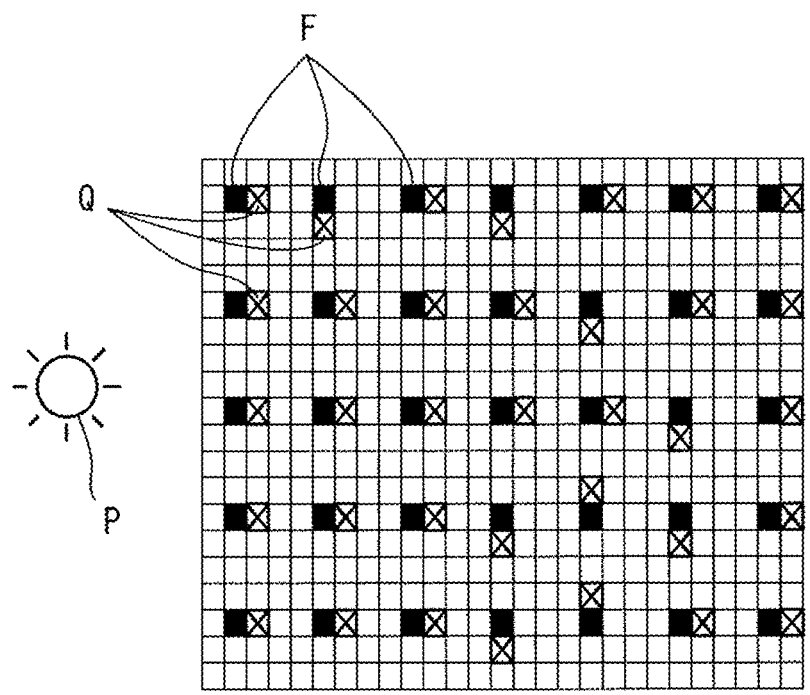
FIG. 17B illustrates example 2 in which the position of a flare light source is determined by the positions of flare-affected pixels.
Figure 17C:
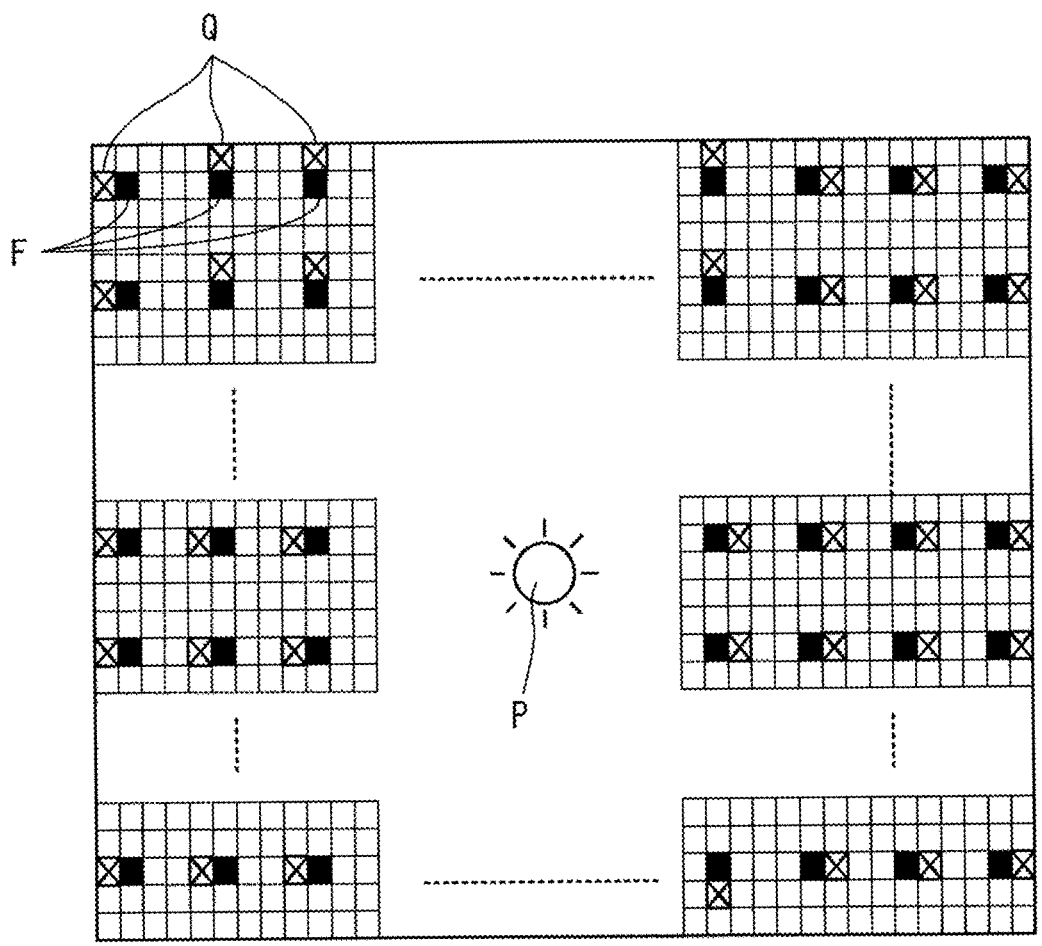
FIG. 17C illustrates example 3 in which the position of a flare light source is determined by the positions of flare-affected pixels.

FIG. 17A, FIG. 17B and FIG. 17C illustrate examples in which the position of a flare light source is determined from the positions of the determined flare-affected pixels. Detection pixels F are in black and the positions of flare-affected pixels Q for the respective detection pixels are denoted by crosses.

For example, the flare light source determinator 126 determines whether or not there are many identical positional relationships among the positional relationships of flare-affected pixels with respect to detection pixels. When there are many identical positional relationships, the flare light source determinator 126 determines that the flare light source is located in the opposite direction from the flare-affected pixels with respect to the detection pixels in those many identical positional relationships. "Many" means being equal to or greater than a prescribed ratio such as 70% for example. Example 1 of FIG. 17A illustrates a case when there are many lower positions as the positions of flare-affected pixels Q with respect to detection pixels F. In such a case, the flare light source determinator 126 determines the position of flare light source P to be the upper side of the screen.

Example 2 of FIG. 17B illustrates a case when there are many right positions as the positions of flare-affected pixels Q with respect to detection pixels F. In such a case, the flare light source determinator 126 determines the position of flare light source P to be the left side of the screen.

Also, when determining that the positional relationships of the flare-affected pixels with respect to the detection pixels are distributed in the upper, lower, left and right directions around a certain point in the screen, the flare light source determinator 126 determines that the position of the flare light source is in the screen. Example 3 of FIG. 17C illustrates a case when the positions of flare-affected pixels Q with respect to detection pixels F are distributed in the upper, lower, left and right directions around a certain point in the screen. In such a case, the flare light source determinator 126 determines the certain point in the screen to be the position of the flare light source.

The pixel collector 128 determines whether or not a flare light source exists on the basis of a result of a determination performed by the flare light source determinator 126 (step S24). When determining that a flare light source exists (YES in step S24), the pixel collector 128 corrects the pixel values of the flare-affected pixels (step S26). The pixel collector 128 may perform interpolation operations on the pixel values of image pixels around the flare-affected pixels so as to replace the pixel values of the flare-affected pixels with the value acquired through the interpolation operations. Also, the pixel collector 128 may for example calculate the weighting average value of pixels having the same color in the vicinities so as to treat the values as the correction values for the flare-affected pixels.

Next, the pixel collector 128 performs interpolation correction on the pixel values of the detection pixels (step S28). When determining that a flare light source does not exist (NO in step S24), the pixel collector 128 performs interpolation correction on the pixel values of the detection pixels (step S28). As described above, the pixel collector 128 performs the interpolation correction on the detection pixel regardless of whether or not a flare light source exists.

The image generator 130 performs various types of processes including a process in which the system is converted into a configuration with 3 CCDs, a white balance process, a color matrix process, gamma correction, a noise reduction process, etc., and converts RAW data into YC data so as to generate an image (step S30).

Conventionally, a pixel affected by flare has been determined and corrected on the basis of the pixel values of pixels that are adjacent to a detection pixel. However, conventional methods in which a pixel affected by flare is determined on the basis of the pixel values of pixels that are adjacent to a detection pixel do not provide sufficient determination accuracy. Insufficient determination accuracy prevents appropriate correction of pixels affected by flare. Further, unnecessary correction is performed on pixels that are not affected by flare, causing noise in some cases. The above embodiment makes it possible to highly accurately determine and correct a pixel affected by flare from among pixels that are adjacent to a detection pixel. Specifically, the above embodiment determines a flare-affected pixel on the basis of not only the maximum value pixel of pixels that are adjacent to a targeted detection pixel but also the maximum value pixel of pixels that are adjacent to a surrounding detection pixel. This can increase the accuracy of detecting flare-affected pixels. Also, because influence from crosstalk from other image pixels is corrected in the determination of maximum value pixels, the accuracy of determining maximum value pixels can be increased. Also, because the influence of orientation information of the image pickup section and subject brightness information is taken into consideration in the determination of maximum value pixels, the detection accuracy of flare-affected pixels can be increased.

Also, because whether or not a flare light source exists is determined on the basis of the ratio and distribution of flare-affected pixels in the screen, flare light source determinations that are incorrect because of the influence of the subject etc. can be prevented. Also, because whether or not a flare light source exists is determined and a flare-affected pixel is corrected only when a flare light source exists, incorrect correction can be prevented.

Note that explanations have been given on an assumption that pixels that are adjacent to detection pixels are image pixels; however they may be detection pixels. Also, explanations have been given on an assumption that the image processor 120 is implemented in a form of hardware such as a gate array etc., the scope of the present embodiments is not limited to this example. For example, the respective functions (the correction value calculator 124*a* etc.) of the pixel specification section 124 may be implemented by a software process performed by the micro computer 150 that has read a prescribed program stored in the flash memory 150.

Also, the camera system 10 may be a system in which the image pickup section including the lens and the imaging device is configured as a separate body from the imaging process section that processes picked-up signals. For example, the camera system 10 may be a system including a camera head for microscopes and an image processing apparatus or may be a system including a scope for endoscopes and an image processing apparatus.

Note that the present invention is not limited exactly to the above embodiments, and can be embodied in the implementation phases by modifying constitutional elements without departing from the spirit of the present invention. Also, it is possible to form various inventions by an appropriate combination of a plurality of constituent elements disclosed in the above embodiments. For example, all the constituent elements disclosed in the above embodiments may be combined appropriately. Further, constituent elements selected from different embodiments may be combined appropriately. It is as a matter of course that these various modification and application are possible without departing from the spirit of the present invention.

EXPLANATIONS OF LETTERS OR NUMERALS

10 CAMERA SYSTEM
100 CAMERA BODY
102 SHUTTER
104 IMAGING DEVICE
106 ANALOG PROCESSOR
108 A/D CONVERTER
110 SUBJECT BRIGHTNESS INFORMATION•ACQUISITION SECTION
112 ORIENTATION INFORMATION ACQUISITION SECTION
114 WB GAIN CALCULATOR
120 IMAGE PROCESSOR
122 PIXEL VALUE ACQUISITION SECTION
124 PIXEL SPECIFICATION SECTION
124A CORRECTION VALUE CALCULATOR
124B MAXIMUM-VALUE PIXEL DETERMINATOR
124C AVERAGE VALUE CALCULATOR
124D DETERMINATOR
126 FLARE LIGHT SOURCE DETERMINATOR
128 PIXEL CORRECTOR
130 IMAGE GENERATOR
150 MICRO COMPUTER
152 FLASH MEMORY
154 SDRAM
160 IMAGE COMPRESSOR
162 IMAGE EXTENSION SECTION
164 MEMORY I/F
166 RECORDING MEMORY
168 DISPLAY DRIVER
170 DISPLAY
172 OPERATION SECTION
174 LENS I/F
180 BUS

What is claimed is:

1. An image processing apparatus comprising:
a pixel value acquisition circuit configured to acquire a pixel value from image data generated by an imaging device that includes a detection pixel; and
a pixel specification circuit configured to specify a flare-affected pixel that is affected by flare, wherein
the pixel value acquisition circuit sets, as a targeted detection pixel, a detection pixel that is a target of a flare determination, and sets, as a surrounding detection pixel, a detection pixel that is arranged around the targeted detection pixel in a prescribed area in a pixel arrangement including the targeted detection pixel,
the pixel value acquisition circuit acquires, from image data, pixel values of a plurality of pixels that are adjacent to the targeted detection pixel and pixel values of a plurality of pixels that are adjacent to the surrounding detection pixel, and
the pixel specification circuit specifies a flare-affected pixel that is affected by flare from among the plurality of pixels that are adjacent to the targeted detection pixel, on the basis of the pixel values of the plurality of pixels that are adjacent to the targeted detection pixel and the pixel values of the plurality of pixels that are adjacent to the surrounding detection pixel.

2. The image processing apparatus according to claim 1, wherein
the pixel specification circuit includes a maximum-value pixel determination circuit and a determination circuit, wherein
the maximum-value pixel determination circuit determines, on the basis of the acquired pixel values, a pixel having a highest pixel value to be a first maximum value pixel from among the plurality of pixels that are adjacent to the targeted detection pixel, and acquires, as a first position, a position of the first maximum value pixel with respect to the targeted detection pixel,
the maximum-value pixel determination circuit further determines a pixel having a highest pixel value to be a second maximum value pixel from among the plurality of pixels that are adjacent to the surrounding detection pixel, and acquires, as a second position, a position of the second maximum value pixel with respect to the surrounding detection pixel, and
the determination circuit determines, on the basis of the first position and the second position, the flare-affected pixel from among the plurality of pixels that are adjacent to the targeted detection pixel.

3. The image processing apparatus according to claim 2, wherein
the determination circuit acquires most positions from among second positions that were acquired respectively for a plurality of the surrounding detection pixels, and determines the first maximum value pixel to be the flare-affected pixel when the most positions and the first position are identical.

4. The image processing apparatus according to claim 2, wherein
the determination circuit acquires most positions from among second positions that were acquired respectively for a plurality of the surrounding detection pixels, and determines, to be the flare-affected pixels, pixels corresponding to the most positions from among the pixels that are adjacent to the targeted detection pixel when the number of the most positions is equal to or greater than a prescribed threshold.

5. The image processing apparatus according to claim 2, wherein
the pixel value acquisition circuit acquires pixel values of a plurality of image pixels that are adjacent to neither the targeted detection pixel nor the surrounding detection pixel in the prescribed area, the pixel specification circuit includes an average value calculation circuit that calculates image pixel average values from the acquired pixel values of the plurality of image pixels, and when the first maximum value pixel has a pixel value that is higher than any of the average values, the determination circuit determines that first maximum value pixel to be the flare-affected pixel.

6. The image processing apparatus according to claim 5, wherein the average value calculation circuit calculates the image pixel average value from image pixels having a same color as a color of the plurality of pixels that are adjacent to the targeted detection pixel from among the plurality of image pixels that are adjacent to neither the targeted detection pixel nor the surrounding detection pixel when the plurality of pixels that are adjacent to the targeted detection pixel have a same color, and calculates the image pixel average value from among R pixels and B pixels that are adjacent to neither the targeted detection pixel nor the surrounding detection pixel in a case of a pixel arrangement in which pixels that are adjacent to the targeted detection pixel have different colors.

7. The image processing apparatus according to claim 2, wherein the pixel value acquisition circuit further acquires pixel values of the plurality of image pixels that are adjacent to neither the targeted detection pixel nor the surrounding detection pixel in the prescribed area, the pixel specification circuit includes an average value calculation circuit that calculates an average value of the acquired pixel values of the plurality of image pixels, the determination circuit determines the flare-affected pixel by applying at least one of three determination methods including a first determination method in which most positions are acquired from second positions respectively acquired for a plurality of the surrounding detection pixels, and when the most positions are identical to the first position, the first maximum value pixel is determined to be the flare-affected pixel, a second determination method in which the most positions are acquired from second positions respectively acquired for a plurality of the surrounding detection pixels, and when a number of the most positions is equal to or greater than a prescribed threshold, pixels corresponding to the most positions from among the pixels that are adjacent to the targeted detection pixel are determined to be the flare-affected pixels, and a third determination method in which when the average value calculated by the average value calculation circuit and the first maximum value pixel are compared and the first maximum value pixel is higher, the first maximum value pixel is determined to be the flare-affected pixel.

8. The image processing apparatus according to claim 2, wherein the pixel specification circuit includes a correction value calculation circuit that calculates a correction value for correcting the acquired pixel value, and the maximum-value pixel determination circuit corrects, by the correction value calculated by the correction value calculation circuit, the acquired pixel value, and determines the first maximum value pixel and the second maximum value pixel.

9. The image processing apparatus according to claim 8, wherein when the plurality of pixels that are adjacent to the targeted detection pixel have a same color, the correction value calculation circuit calculates correction values of the plurality of pixels that are adjacent to the targeted detection pixel and the surrounding detection pixel on the basis of a pixel value of a pixels having a same color as a color of the plurality of pixels that are adjacent to the targeted detection pixel from among the plurality of image pixels that are adjacent to neither the targeted detection pixel nor the surrounding detection pixel.

10. The image processing apparatus according to claim 9, wherein when a pixel arrangement of the imaging device is a Bayer arrangement, the correction value calculation circuit calculates average value Grave of pixel values of Gr pixels that are arranged in a red line and average value Gbave of pixel values of Gb pixels that are arranged in a blue line from among the plurality of image pixels that are not adjacent, and calculates the correction value from a difference value or a ratio between the Grave and the Gbave.

11. The image processing apparatus according to claim 8, wherein when the plurality of pixels that are adjacent to the targeted detection pixel have different colors, the correction value calculation circuit calculates a correction value on the basis of a white balance gain corresponding to colors of the plurality of pixels that are adjacent to the targeted detection pixel.

12. The image processing apparatus according to claim 2, comprising an orientation information acquisition circuit configured to acquire orientation information of an image pickup section that includes the imaging device, and a subject brightness information acquisition circuit configured to acquire subject brightness information, wherein the maximum-value pixel determination circuit performs weighted correction respectively on the pixel values of the plurality of pixels that are adjacent to the targeted detection pixel and on the pixel values of the plurality of pixels that are adjacent to the surrounding detection pixel on the basis of at least one of the orientation information of the image pickup section and the subject brightness information, and determines the first maximum value pixel and the second maximum value pixel.

13. The image processing apparatus according to claim 1, comprising a flare light source determination circuit configured to determine whether or not a flare light source exists, wherein the pixel value acquisition circuit sequentially acquires the pixel value corresponding to each targeted detection pixel while switching the targeted detection pixel for a plurality of detection pixels that are included in the image data, the pixel specification circuit specifies a flare-affected pixel corresponding to each of the plurality of detection pixels on the basis of the pixel values that correspond to the targeted detection pixels sequentially acquired by the pixel value acquisition circuit, and the flare light source determination circuit determines whether or not the flare light source exists on the basis of information of the flare-affected pixel corresponding to each of the plurality of detection pixels specified by the pixel specification circuit.

14. The image processing apparatus according to claim 13, wherein
the flare light source determination circuit determines that the flare light source exists when there are a greater number of the flare-affected pixels than a prescribed number in a screen.

15. The image processing apparatus according to claim 13, wherein
the flare light source determination circuit determines a position of the flare light source on the basis of positional relationships of flare-affected pixels with respect to the detection pixels.

16. The image processing apparatus according to claim 15, wherein
when positional relationships of flare-affected pixels with respect to the detection pixels involve a greater number of identical positional relationships than a prescribed number, the flare light source determination circuit determines that the flare light source is located in an opposite direction from the flare-affected pixels for the detection pixels in the identical positional relationships.

17. An image processing apparatus according to claim 15, wherein
when it is determined that the positional relationships of flare-affected pixels with respect to the detection pixels are distributed in upper, lower, left and right directions around a point in a screen, the flare light source determination circuit determines that the flare light source is located in a screen.

18. The image processing apparatus according to claim 14, comprising
a pixel correction circuit configured to correct a flare-affected pixel specified by the pixel specification circuit when it is determined, by the flare light source determination circuit, that a flare light source exists.

19. An image processing method for specifying a flare-affected pixel, the image processing method comprising:
setting, as a targeted detection pixel, a detection pixel that is a target of a flare determination from among pixels of an imaging device that includes a detection pixel,
setting, as a surrounding detection pixel, a detection pixel that is arranged around the targeted detection pixel in a prescribed area in a pixel arrangement including the targeted detection pixel,
acquiring, from image data, pixel values of a plurality of pixels that are adjacent to the targeted detection pixel and pixel values of a plurality of pixels that are adjacent to the surrounding detection pixel, and
specifying a flare-affected pixel that is affected by flare from among the plurality of pixels that are adjacent to the targeted detection pixel, on the basis of the pixel values of the plurality of pixels that are adjacent to the targeted detection pixel and the pixel values of the plurality of pixels that are adjacent to the surrounding detection pixel.

20. A non-transitory computer-readable medium storing a computer program for causing a computer to execute an image processing method for specifying a flare-affected pixel, the computer program comprising:
setting, as a targeted detection pixel, a detection pixel that is a target of a flare determination from among pixels of an imaging device that includes a detection pixel,
setting, as a surrounding detection pixel, a detection pixel that is arranged around the targeted detection pixel in a prescribed area in a pixel arrangement including the targeted detection pixel,
acquiring, from image data, pixel values of a plurality of pixels that are adjacent to the targeted detection pixel and pixel values of a plurality of pixels that are adjacent to the surrounding detection pixel, and
specifying a flare-affected pixel that is affected by flare from among the plurality of pixels that are adjacent to the targeted detection pixel, on the basis of the pixel values of the plurality of pixels that are adjacent to the targeted detection pixel and the pixel values of the plurality of pixels that are adjacent to the surrounding detection pixel.

* * * * *